(12) United States Patent
Carpi et al.

(10) Patent No.: US 6,368,516 B1
(45) Date of Patent: Apr. 9, 2002

(54) SEMICONDUCTOR MANUFACTURING METHODS (75) Inventors: Enio L. Carpi, Fishkill; Steffen F. Schulze, Wappingers Falls, both of NY (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/339,519

(22) Filed: Jun. 24, 1999

(51) Int. Cl.[7] .................................................. B44C 1/22
(52) U.S. Cl. ............................ 216/41; 216/12; 216/49; 216/84; 430/5
(58) Field of Search ......................... 216/12, 41, 49, 216/59, 66, 84; 430/5

(56) References Cited

U.S. PATENT DOCUMENTS

| | | | | |
|---|---|---|---|---|
| 4,542,397 A | * | 9/1985 | Biegelsen et al. | 257/723 |
| 5,308,722 A | * | 5/1994 | Nistler | 430/5 |
| 5,718,829 A | * | 2/1998 | Pierrat | 216/12 |
| 5,981,110 A | * | 11/1999 | George et al. | 430/5 |
| 6,151,103 A | * | 11/2000 | Shu et al. | 355/71 |
| 6,165,649 A | * | 12/2000 | Grenon et al. | 430/5 |
| 6,270,685 B1 | * | 8/2001 | Ishio et al. | 216/2 |

* cited by examiner

*Primary Examiner*—Randy Gulakowski
*Assistant Examiner*—Shamim Ahmed (57) ABSTRACT

A method is provided for determining a measure of corner rounding produced in a mask structure. The method includes providing an un-patterned mask structure having a transparent substrate, an opaque layer on the substrate and a photoresist on the opaque layer. A corner rounding test pattern is etched into the photoresist. The pattern exposes underlying portions of the opaque layer. The pattern is in the shape of a pair of intersecting perpendicular lines of the photoresist. The exposed portions of the opaque layer are brought into contact with a etch to remove the exposed portions of the opaque layer and to thereby expose underlying portions of the substrate. In one embodiment, the etch is a wet etch and undercuts the photoresist to remove unexposed portions of the opaque layer disposed adjacent to the exposed portions of the opaque layer. The photoresist is removed to produce mask structure. A defect is produced in the opaque layer of the mask structure, such defect being produced as a result of rounded corners, rather than square corners. The defect is formed in the opaque layer in region at the intersection of the pair of intersecting perpendicular lines of the photoresist. The defect is measured to provide an indication of the degree of corner rounding. With such method, standard measuring equipment, such as line width measuring equipment of defect detecting equipment can be used to determine the degree of corner rounding being produced in the semiconductor structure being formed concurrently with the test pattern.

12 Claims, 10 Drawing Sheets

SEMICONDUCTOR MANUFACTURING METHODS

BACKGROUND OF THE INVENTION

This invention relates generally to semiconductor manufacturing methods and more particularly to masks, and the formation of masks, used in such manufacturing methods.

As is known in the art, fabrication of semiconductor integrated circuits involves transferring a sequence of patterns onto a surface of a semiconductor body. The patterns are formed by masks, each mask having a desired pattern. More particularly, an un-patterned mask is initially provided, such mask having: a transparent substrate, such as quartz; an opaque layer, such as chrome over the substrate; and, a layer of photoresist over the opaque layer. The photoresist is patterned with the desired pattern using an electron, or light beam. The patterned photoresist is then exposed to an etch which thereby exposes underlying portions of the opaque layer. That is, the pattern in the photoresist is transferred to the opaque layer. The exposed portions of the opaque layer are etched to expose underlying portions of the transparent substrate. The photoresist is then removed thereby forming the patterned mask.

As is also known in the art, the electron, or light beam process used to pattern the photoresist will not produce perfectly square corners; rather, the corners will be somewhat rounded. Further, the etching of the exposed portions of the opaque layer by a wet isotropic etch will result in lateral undercutting into the opaque layer, an effect sometimes referred to as edge process bias. These effects, i.e., corner rounding and edge process bias, can adversely effect the accuracy of the mask and hence the accuracy of the devices formed in the semiconductor body.

More particularly, the pattern fidelity in masks for small ground rule geometries, i.e., 250 nm and beyond, DRAM products is becoming an important quality parameter. One of the latest requirements in mask building is to monitor the amount of corner rounding on the mask. Corner rounding measurements, however, are difficult. Known methods are based on an optical inspection of checkerboard-type structures, or image processing of an SEM picture of a certain structure. The former is time consuming, not automatic, and strongly dependant on the operators skill; the latter requires an additional coating and clean step in addition to the SEM measurement. Another type of corner rounding measurement is based on a line shortening effect produced as a result of the corner rounding effect. Such measurement uses the length of the shortened line. Because these measurements are made over the small end portion of the structure, i.e., a test region of the mask, the reproducibility is relatively low and also strongly dependant on an operator taking the measurement.

SUMMARY OF THE INVENTION

A method is provided for determining a measure of corner rounding produced in a mask structure. The method includes providing an un-patterned mask structure having a transparent substrate, an opaque layer on the substrate, and a photoresist on the opaque layer. A corner rounding test pattern is etched (i.e., transferred) into the photoresist. The pattern exposes underlying portions of the opaque layer. The pattern is in the shape of a pair of intersecting perpendicular lines of the photoresist. The exposed portions of the opaque layer are brought into contact with an etch to remove the exposed portions of the opaque layer and to thereby expose underlying portions of the substrate. The photoresist is removed to produce mask structure. A defect (i.e., a corner rounding effect produced defect) is produced in the opaque layer of the mask structure, such defect being produced as a result of rounded corners, rather than square corners. The defect is formed in a region at the intersection of the pair of intersecting perpendicular lines of the photoresist. The defect is measured to provide an indication of the degree of corner rounding.

With such method, standard measuring equipment, such as line width measuring equipment or defect detecting equipment can be used to determine the degree of corner rounding produced in the mask.

In accordance with one embodiment, a method is provided for determining a measure of corner rounding produced in a mask structure. The method includes providing an un-patterned mask structure having a transparent substrate, an opaque layer on the substrate, and a photoresist on the opaque layer. A corner rounding test pattern is etched into the photoresist. The pattern exposes underlying portions of the opaque layer. The pattern is in the shape of a pair of intersecting perpendicular lines of the photoresist. The exposed portions of the opaque layer are brought into contact with a wet etch to remove the exposed portions of the opaque layer and to thereby expose underlying portions of the substrate. The etch undercuts the photoresist to remove unexposed portions of the opaque layer disposed adjacent to the exposed portions of the opaque layer. That is the isotropic etch etches laterally into the edges of the opaque layer (i.e., edge process bias). The photoresist is removed to produce mask structure. A defect (i.e., a corner rounding effect produced defect) is produced in the opaque layer of the mask structure, such defect being produced as a result of rounded corners, rather than square corners. The defect is formed in a region at the intersection of the pair of intersecting perpendicular lines of the photoresist. The defect is measured to provide an indication of the degree of corner rounding.

In accordance with another aspect of the invention, the intersecting lines of the photoresist have widths selected to produce a defect having a size related to the degree of the produced corner rounding.

In accordance with still another aspect of the invention, the measurement includes measuring the size of the produced defect.

In accordance with still another aspect of the invention, the width of one of the intersecting lines of the photoresist is greater than the width of the other one of the intersecting lines.

In accordance with one embodiment of the invention a method is provided for determining a measure of corner rounding produced in a mask structure. The method includes providing an un-patterned mask structure having a transparent substrate, an opaque layer on the substrate, and a photoresist on the opaque layer. A corner rounding test pattern is etched into the photoresist, such pattern exposing underlying portions of the opaque layer, such pattern being formed in a predetermined shape. The shape includes: a first line; and, an array of laterally spaced parallel lines, such parallel lines being perpendicular to, and intersecting, the first line at laterally spaced intersection regions along the first line. An etch is brought into contact with the exposed portions of the opaque layer to remove the exposed portions of the opaque layer. The photoresist is removed to produce the mask structure. The corner rounding effect defect produced in the opaque layer of the mask structure along the first line is measured. The defect is produced as a result of rounded corners, rather than square corners, being etched in forming the intersections along the first line by the array of parallel lines.

In accordance with one embodiment, the etch is an isotropic etch to remove the exposed portions of the opaque layer and to thereby expose is underlying portions of the substrate. The etch undercuts the photoresist to remove unexposed portions of the opaque layer disposed adjacent to the exposed portions of the opaque layer.

In accordance with another embodiment of the invention, a method is provided for determining a measure of corner rounding produced in a mask structure. Here again, an un-patterned mask structure is provided having a transparent substrate, an opaque layer on the substrate, and a photoresist on the opaque layer. A corner rounding test pattern is etched into the photoresist, such pattern exposing underlying portions of the opaque layer. The pattern comprising an array rectangular-shaped openings in the photoresist to expose underlying portions of the opaque layer. The rectangular-shaped openings are separated by a pair of intersecting lines of the photoresist. The exposed portions of the opaque layer are brought into contact with an etch to remove the exposed portions of the opaque layer to thereby expose underlying portions of the substrate. A first one of the lines of the photoresist separating the rectangular-shaped openings is in the order of the predetermined undercutting depth. The etching of the opaque layer forms a triangular-shaped region in the opaque layer as a result of corner rounding effects in forming the array of rectangular-shaped openings in the photoresist. The triangular-shaped region, i.e., a corner rounding effect produced defect, has an altitude along the first one of the lines of the photoresist and a base along a second one of the lines of the photoresist. The altitude is related to the amount of such corner rounding. The photoresist is removed to produce the mask structure. Variations in the width of the line of opaque layer are measured, such width variations being produced as a result of the altitude of the triangular-shaped region resulting from the rectangular-shaped opening in the photoresist being formed with rounded corners, rather than square corners.

In one embodiment, the etch undercuts the photoresist a predetermined depth as a result of etch process bias to remove unexposed portions of the opaque layer disposed adjacent to the exposed portions of the opaque layer.

In accordance with another embodiment of the invention, a method is provided for determining a measure of corner rounding produced in a mask structure. Here again, an un-patterned mask structure is provided having a transparent substrate, an opaque layer on the substrate, and a photoresist on the opaque layer. A corner rounding test pattern is etched into the photoresist, such pattern exposing underlying portions of the opaque layer. The pattern comprising an array rectangular-shaped openings in the photoresist to expose underlying portions of the opaque layer. The rectangular-shaped openings are separated by a pair of intersecting lines of the photoresist. The exposed portions of the opaque layer are brought into contact with a etch to remove the exposed portions of the opaque layer to thereby expose underlying portions of the substrate. Both of the lines of the photoresist separating the rectangular-shaped openings are in the order of the predetermined undercutting depth. The etching of the opaque layer forms a diamond-shaped region in the opaque layer as a result of corner rounding effects in forming the array of rectangular-shaped openings in the photoresist. The diamond-shaped region, i.e., a corner rounding effect produced defect, has a size related to the amount of such corner rounding. The photoresist is removed to produce the mask structure. Defect measuring equipment is used to detect and measure the size of the diamond-shaped region to thereby provide a measure of the corner rounding effect.

In one embodiment, the etch undercuts the photoresist a predetermined depth as a result of etch process bias to remove unexposed portions of the opaque layer disposed adjacent to the exposed portions of the opaque layer.

BRIEF DESCRIPTION OF THE DRAWING

These and other features of the invention will become more readily apparent from the following detailed description when taken together with the accompanying drawings, in which.

DESCRIPTION OF THE PREFERRED EMBODIMENTS

Figure 1:
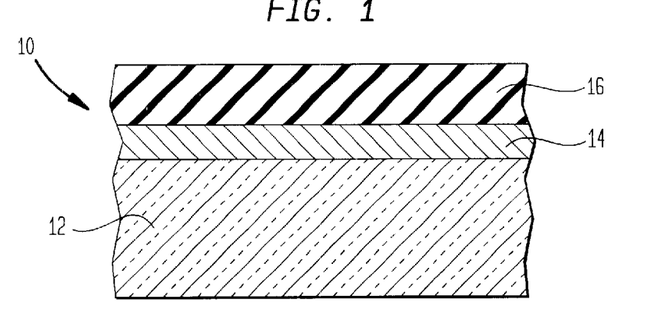
FIG. 1 is a cross section of an un-patterned mask structure adapted for having patterned therein a corner rounding test pattern according to the invention.

Referring now to FIGS. 1, an un-patterned mask structure 10 is shown having: a transparent substrate 12, here, for example, quartz; an opaque layer 14, here, for example, chrome, on the substrate 12; and, a photoresist 16 on the opaque layer 14.

Figure 1A:
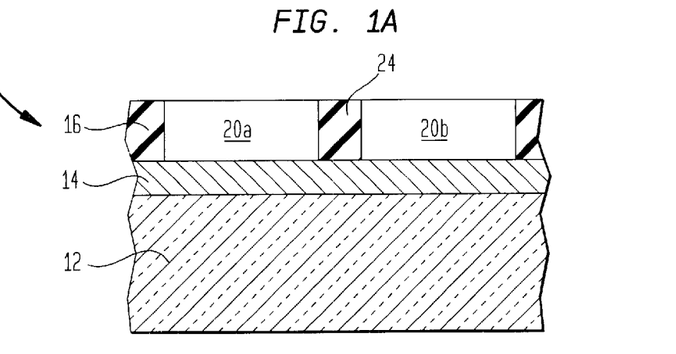
FIG. 1A is a cross section of the mask structure of FIG. 1 having the test pattern etched into a photoresist of the mask structure under ideal, non-corner rounding conditions.
Figure 1B:
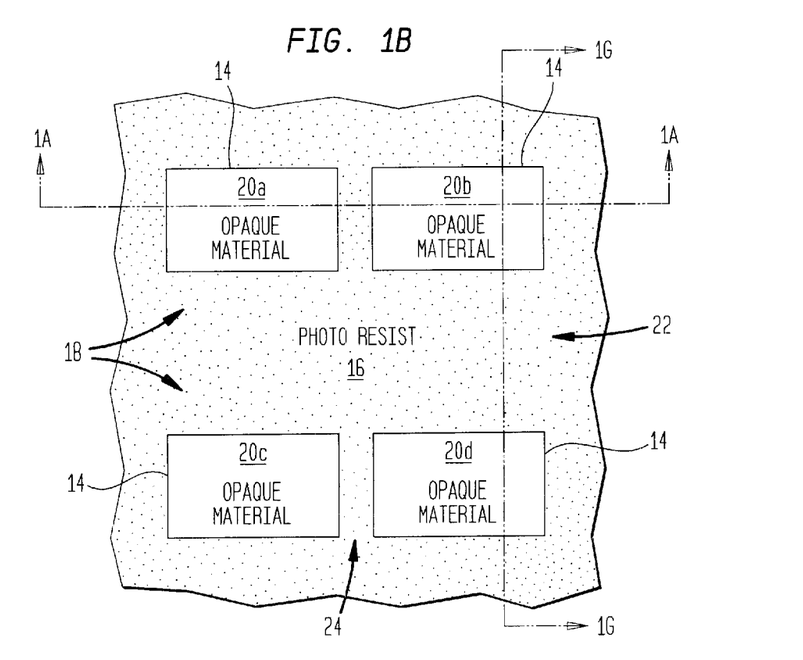
FIG. 1B is a plan view of the mask structure of FIG. 1A having the test pattern etched into a photoresist of the mask structure under ideal, non-corner rounding conditions, the cross section of FIG. 1A being taken along line 1A—1A in FIG. 1B, and the cross section of FIG. 1G being taken along line 1G—1G in FIG. 1B.
Figure 1C:
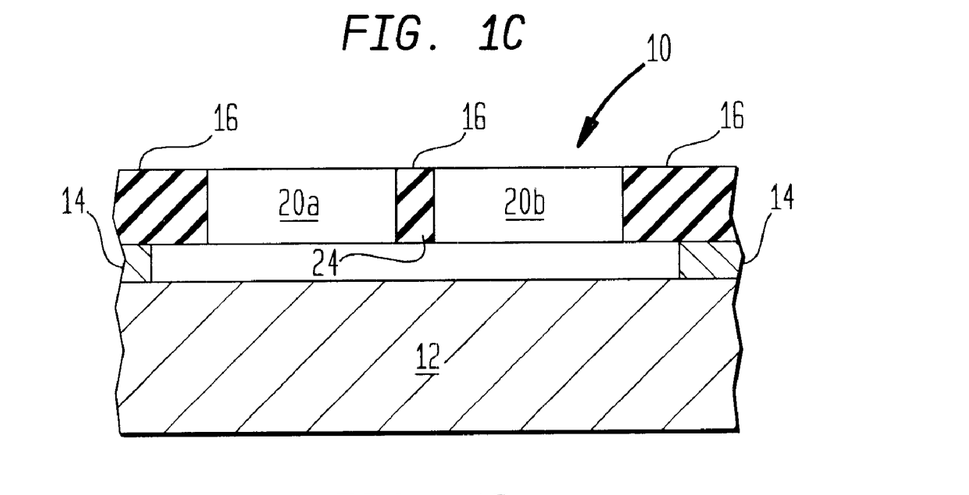
FIG. 1C is a cross section of the mask structure of FIG. 1 having the test pattern etched into a photoresist of the mask structure under the ideal, corner rounding conditions shown in FIG. 1B transferred and etched into underlying exposed portions of an opaque layer of the mask structure of FIG. 1.
Figure 1D:
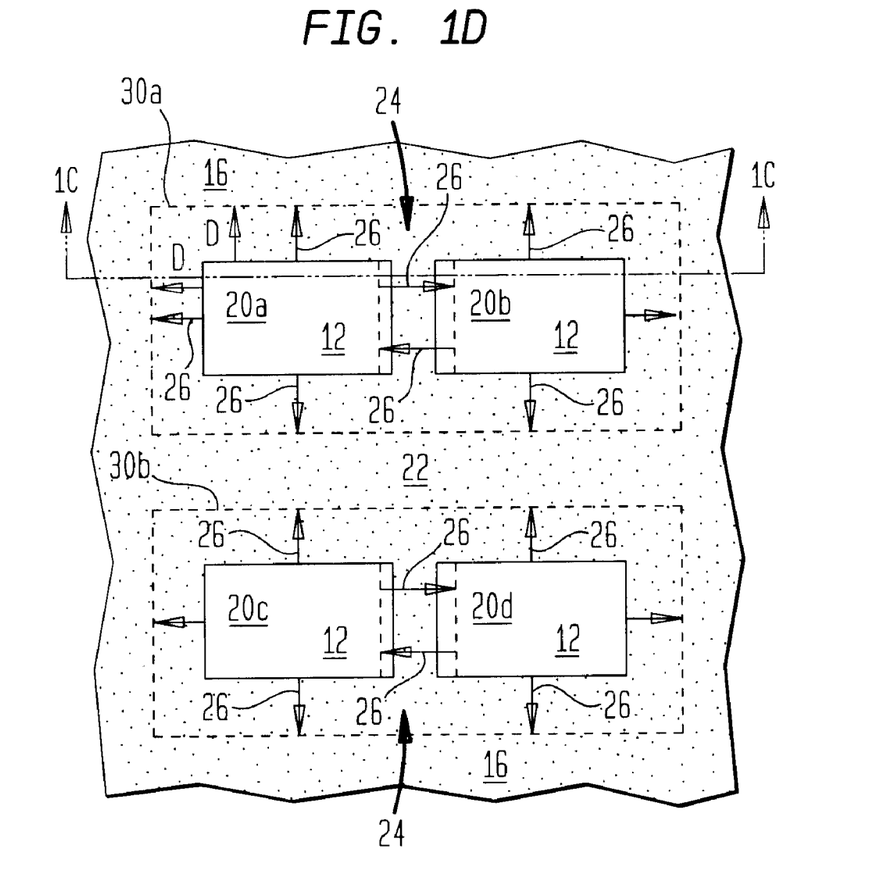
FIG. 1D is a plan view of the mask structure of FIG. 1C having the test pattern etched into a photoresist of the mask structure under the ideal, corner rounding conditions shown in FIG. 1B, transferred and etched into underlying exposed portions of an opaque layer of the mask structure of FIG. 1, the cross section of FIG. 1C being taken along line 1C—1C in FIG. 1D.
Figure 1E:
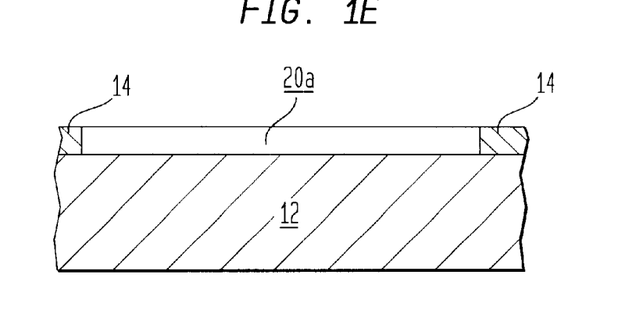
FIG. 1E is a cross section of the mask structure of FIG. 1 having the test pattern etched into a photoresist of the mask structure shown in FIG. 1D, transferred and etched into underlying exposed portions of an opaque layer with the photoresist removed.
Figure 1F:
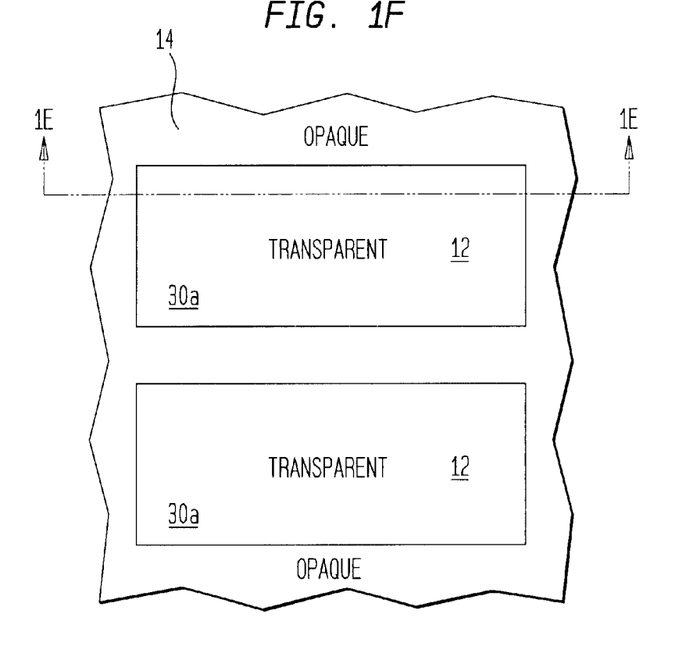
FIG. 1F is a plan view of the mask structure of FIG. 1E having the test pattern etched into a photoresist of the mask structure shown in FIG. 1D, transferred and etched into underlying exposed portions of an opaque layer with the photoresist removed, the cross section of FIG. 1F being taken along line 1E—1E in FIG. 1F.
Figure 1G:
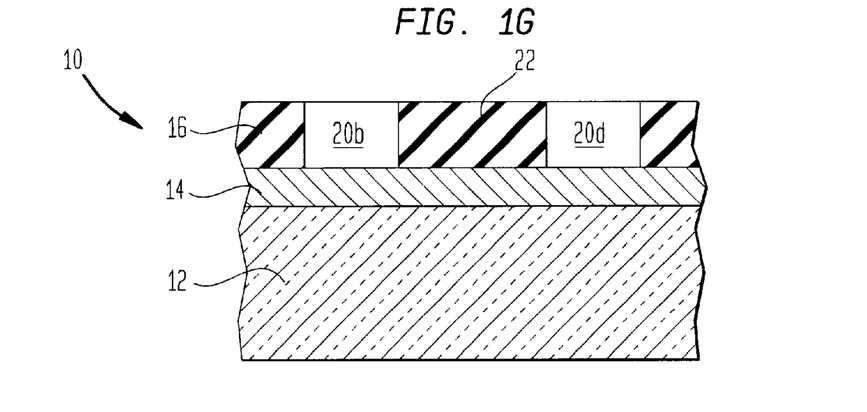
FIG. 1G is a cross section of the mask structure of FIG. 1 having the test pattern etched into a photoresist of the mask structure under ideal, non-corner rounding conditions.

Referring now to FIG. 1A, 1G and 1B, a corner rounding test pattern 18 (FIG. 1B) is etched into a portion of the photoresist 16. The etched pattern 18 thereby exposes an underlying portion of the opaque layer 14. Here, the test pattern 18 comprises a four quadrant array of rectangular-shaped openings 20a, 20b, 20c, and 20d in the photoresist 16. The openings 20a, 20b, 20c and 20d thereby expose underlying portions of the opaque layer 14. In the ideal case, as shown in FIG. 1B, the corners of the rectangular-shaped openings 20a, 20b, 20c, and 20d are square; however, as will be described in connection with FIGS. 2A, 2B, 2C, 2D, 2E and 2F, the corners will, in a real (i.e., practical) case, be rounded. The rounding is mainly due to the intensity distribution of the electron or light beam used to form the pattern 18 in the photoresist 14.

Referring again to FIGS. 1A, 1G and 1B, the rectangular-shaped openings are separated by a pair of intersecting lines 22, 24 of the photoresist 16. More particularly, the left rectangular-shaped openings 20a, 20c are separated from the right rectangular-shaped openings 20b, 20d by a relatively narrow vertical line 24 of the photoresist 16. The upper rectangular-shaped openings 20a, 20b are separated from the lower rectangular-shaped openings 20c, 20d by a relatively wide horizontal line 22 of the photoresist 16. That is, as noted above, the test pattern 18 comprises a four quadrant array of the rectangular-shaped openings 20a, 20b, 20c and 20d. It is noted that here, in this example, the vertical line 24 in the photoresist 16 is narrower than the horizontal line 22. That is, the separation between the right pair of rectangular-shaped openings 20b, 20d and left pair of rectangular-shaped openings 20a, 20c is less than the separation between the upper and lower pairs of rectangular-shaped openings 20a, 20b and 20c, 20d, respectively.

Next, a wet, isotropic etch is brought into contact with the structure 10. As shown in FIGS. 1C and 1D, the etch removes the portions of the opaque layer 14 exposed by the rectangular-shaped openings 20a, 20b, 20c and 20d in the photoresist 16 to produce the structure shown in FIGS. 1C and 1D. The removed portions of the opaque layer 14 expose underlying portions of the transparent substrate 12. As noted above, the wet etch is an isotropic etch and therefore undercuts the photoresist 16 and etches outwardly (i.e., laterally) into exposed edge portions of the opaque layer 16 as indicated by the arrows 26 in FIG. 1D a predetermined depth, D, to thereby remove unexposed portions of the opaque layer 14 disposed adjacent to the portions of the opaque layer 14 exposed by the rectangular-shaped openings 20a, 20b, 20c and 20d. In short, the isotropic etch increases the size of the rectangular-shaped openings 20a, 20b, 20c and 20d when such openings are transferred to the opaque layer 14 because of etch process bias. The vertical line 24 of the photoresist 16 separating the right and left pairs of rectangular-shaped openings 20a, 20c and 20b, 20d, respectively, is slightly less than, or in the order of, the predetermined undercutting depth, D, while the horizontal line 22 has a width greater than the predetermined undercutting depth, D. For example, a typical amount of this undercutting is 100 nm per edge. Thus, the left pair of rectangles 20a, 20c should be placed 50 nm apart from the right pair of rectangles 20b, 20d. The width of the horizontal line 22 of the photoresist 16 separating the upper pair of rectangular-shaped openings 20a, 20c from the lower pair of rectangular-shaped openings 20b, 20d, is greater than the amount of the expected isotropic etching, D.

The resulting edges of the opaque layer 14 are shown in phantom in FIG. 1D, it being noted that because the lateral undercutting of rectangular-shaped openings 20a, 20b, 20c and 20d, the entire region of the opaque layer under the horizontal line 24 of the photoresist 16 is removed, as shown more clearly in FIG. 1C. Thus, instead on an upper pair of horizontally spaced rectangular-shaped openings corresponding to openings 20a, 20b in photoresist layer 16 being transferred into the opaque layer 14, only one, larger rectangular-shaped opening 30a is formed in the opaque layer 14. Likewise, instead on a lower pair of horizontally spaced rectangular-shaped openings corresponding to openings 20c, 20d in photoresist layer 16 being transferred into the opaque layer 14, only one, larger rectangular-shaped opening 30b is formed in the opaque layer 14. In short, the effect of the undercutting and the horizontal spacing of the rectangular-shaped openings, i.e., the width of the vertical line 24 of the photoresist 16, the each of the two upper rectangular-shaped openings and lower rectangular-shaped openings to form two rectangular-shaped regions 30a, 30b in the opaque layer 14.

Next, referring to FIGS. 1E and 1F, the photoresist 16 is removed resulting in only the pair of relatively large upper and lower rectangular-shaped openings 30a, 30b in the opaque layer 14 thereby exposing underlying rectangular-shaped surface portions of the transparent substrate 12.

Figure 2A:
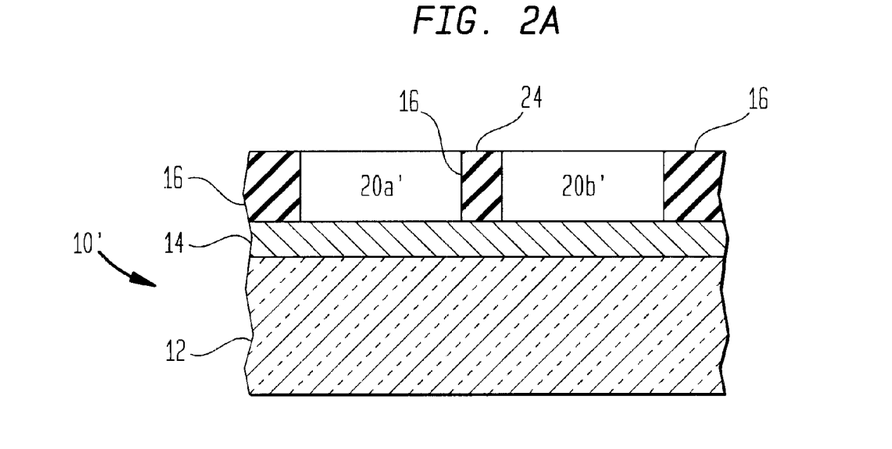
FIG. 2A is a cross section of the mask structure of FIG. 1 having the test pattern etched into a photoresist of the mask structure under real, corner rounding conditions.
Figure 2B:
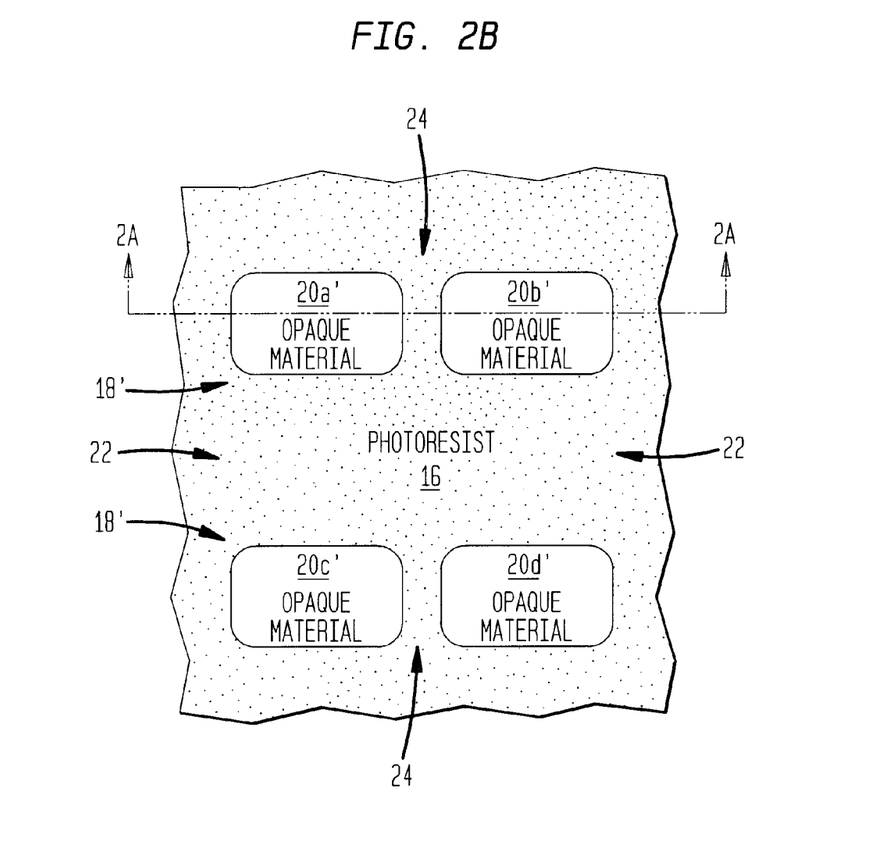
FIG. 2B is a plan view of the mask structure of FIG. 2A having the test pattern etched into a photoresist of the mask structure under real, corner rounding conditions, the cross section of FIG. 2A being taken along line 2A—2A in FIG. 2B.

Referring now to FIGS. 2A–2F, the effect of corner rounding in the forming a real, i.e., practical, test pattern 18' in the photoresist 16 will be described. Thus, referring to FIG. 1 the same un-patterned mask structure 10 is provided having: the transparent substrate 12, here, for example, quartz; the opaque layer 14, here, for example, chrome, on the substrate 12, and, the photoresist 16 on the opaque layer 14. Here again, the same four quadrant array of rectangular-shaped openings are etched into the photoresist. Here, however, as shown in FIG. 2B, such rectangular-shaped openings have rounded corners as indicated in FIG. 2B by openings 20'a, 20'b, 20'c and 20'd. Here, again, the rectangular-shaped openings 20'a, 20'b, 20'c and 20'd are separated by the pair of intersecting lines 22, 24 of the photoresist 16. That is, the test pattern 18' comprises a four quadrant array of the rectangular-shaped openings 20'a, 20'b, 20'c and 20'd. Here again, the vertical line 24 in the photoresist 16 is narrower than the horizontal line 22. That is, the separation between the right pair of rectangular-shaped openings 20'b, 20'd and left pair of rectangular-shaped openings 20'a, 20'c is less than the separation between the upper and lower pairs of rectangular-shaped openings 20'a, 20'b and 20'c, 20'd, respectively.

That is, as with the test pattern 18 described above in connection with FIGS. 1A and 1B, the vertical line 24 of the photoresist 16 separating the right and left pairs of rectangular-shaped openings 20'a, 20'c and 20'b, 20'd, respectively, is slightly less than, or in the order of, the predetermined undercutting depth, D, while the horizontal line 22 has a width greater than the predetermined undercutting depth, D, For example, a typical amount of this undercutting is 100. Thus, the left pair of rectangles 20'a, 20'c should be placed 50 nm apart from the right pair of rectangles 20'b, 20'd. The width of the horizontal line 22 of the photoresist 16 separating the upper pair of rectangular-shaped openings 20'a, 20'c from the lower pair of rectangular-shaped openings 20'b, 20'd, is greater than the amount of the expected isotropic etching, D.

Figure 2C:
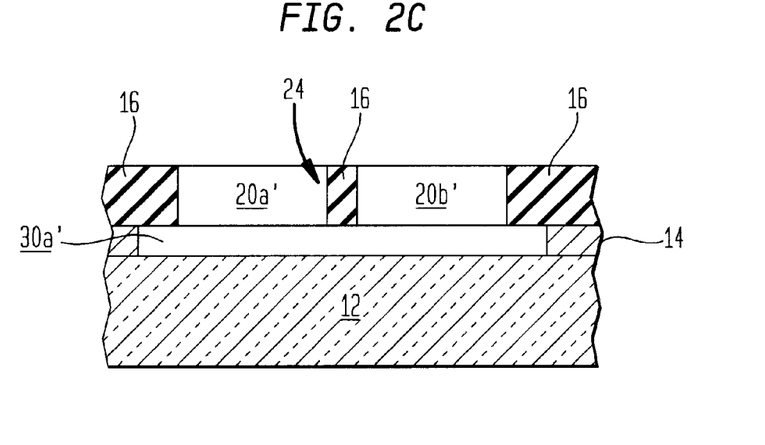
FIG. 2C is a cross section of the mask structure of FIG. 1 having the test pattern etched into a photoresist of the mask structure under the real, non-corner rounding conditions, transferred and etched into underlying exposed portions of an opaque layer.
Figure 2D:
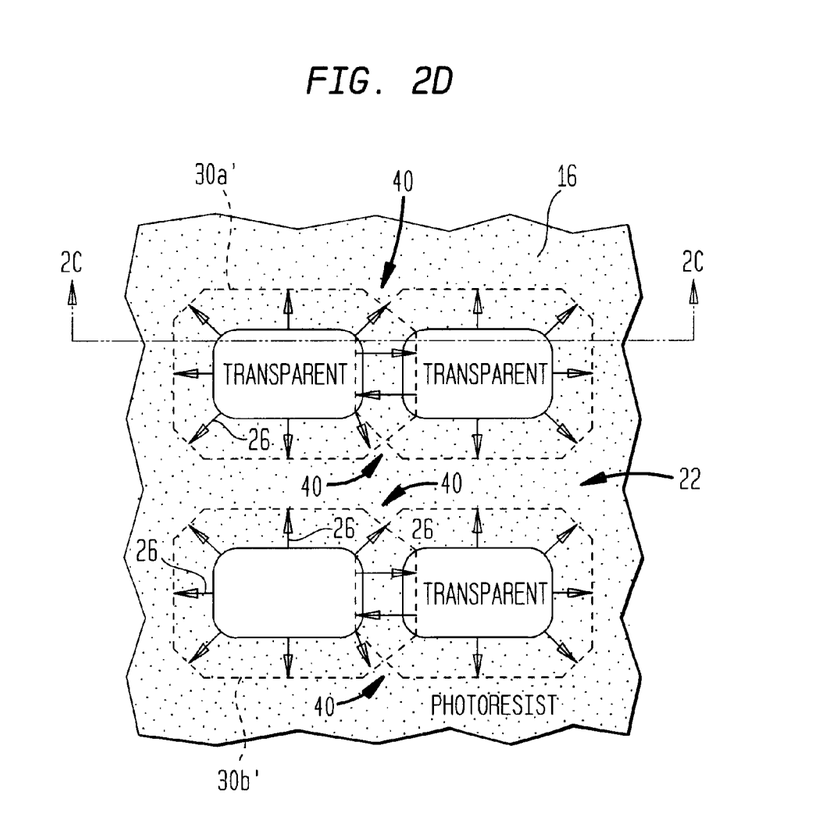
FIG. 2D is a plan view of the mask structure of FIG. 2C having the test pattern etched into a photoresist of the mask structure under the real, non-corner rounding conditions, transferred and etched into underlying exposed portions of an opaque layer, the cross section of FIG. 2C being taken along line 2C—2C in FIG. 2D.

Next, the wet, isotropic etch is brought into contact with the structure shown in FIGS. 2A and 2B. Here again, there is undercutting of the photoresist 16 (i.e., etch process bias) to thereby etch enlarged rectangular-shaped openings in the opaque layer, as indicated in FIGS. 2C and 2D. As noted above, the wet etch is an isotropic etch and therefore undercuts the photoresist 16 and etches outwardly into exposed edge portions of the opaque layer 16 as indicated by the arrows 26 in FIG. 2D a predetermined depth, D, to thereby remove unexposed portions of the opaque layer 14 disposed adjacent to the portions of the opaque layer 14 exposed by the rectangular-shaped openings 20'a, 20'b, 20'c and 20'd. In short, the isotropic etch increases the size of the rectangular-shaped openings 20'a, 20'b, 20'c and 20'd when such openings are transferred to the opaque layer 14. The vertical line 24 of the photoresist 16 separating the right and left pairs of rectangular-shaped openings 20'a, 20'c and 20'b, 20'd, respectively, is slightly less than, or in the order of, the predetermined undercutting depth, D, while the horizontal line 22 has a width greater than the predetermined undercutting depth, D, For example, a typical amount of this undercutting is 100 nm. Thus, the left pair of rectangles 20'a, 20'c should be placed 50 nm apart from the right pair of rectangles 20'b, 20'd. The width of the horizontal line 22 of the photoresist 16 separating the upper pair of rectangular-shaped openings 20'a, 20'c from the lower pair of rectangular-shaped openings 20'b, 20'd, is greater than the amount of the expected isotropic etching, D.

The resulting edges of the opaque layer 14 are shown in phantom in FIG. 2D, it being noted that because the lateral undercutting of rectangular-shaped openings 20'a, 20'b, 20'c and 20'd, the entire region of the opaque layer under the horizontal line 24 of the photoresist 16 is removed, as shown more clearly in FIG. 2C. Thus, instead of an upper pair of horizontally spaced rectangular-shaped openings corresponding to openings 20'a, 20'b in photoresist layer 16 being transferred into the opaque layer 14, only one, larger rectangular-shaped opening 30'a is formed in the opaque layer 14. Here, however, because of corner rounding triangular shaped regions 40 of the opaque layer 16 remain. Likewise, instead on a lower pair of horizontally spaced rectangular-shaped openings corresponding to openings 20'c, 20'd in photoresist layer 16 being transferred into the opaque layer 14, only one, larger rectangular-shaped opening 30'b is formed in the opaque layer 14. Here, however, because of corner rounding triangular-shaped region 40 of the opaque layer 16 remain at the center of the original four rectangular-shaped regions 20'a, 20'b, 20'c and 20'd; i.e., at the region of the intersection of the lines 22, 24 of the photoresist 16.

To put it another way, the width of the horizontal line 22 (FIG. 2B) in the photoresist 16 is larger than twice the undercutting depth, the bottom sides of the upper pair of rectangular-shaped openings being etched in the opaque layer 14 do not meet the upper sides of the lower pair of rectangular-shaped opening being etched in the opaque layer 14. On the other hand, the right side of the left rectangular-shaped openings being etched in the opaque layer 14 do meet the left side of the right hand rectangular-shaped openings being etched in the opaque layer 16. Further, it should be noted that, because of corner rounding the right hand rounded corners of the left rectangular-shaped openings in the opaque layer 14 do not meet the left hand rounded corners of the right hand rectangular-shaped openings in the opaque layer 14 thereby leaving the triangular-shaped regions 40, Further, triangular-shaped region 40 has an altitude, H, along the vertical direction and a base along a the horizontal line 22 of the photoresist 16. Further, the height, H, of the altitude is related to the amount of such corner rounding; i.e., the greater the amount of corner rounding, the greater the height of the altitude. It is also noted that a line of opaque layer is formed having a width at the region of intersection between the horizontal and vertical lines of the photoresist which is greater than the width of in other portions of the such line of opaque layer. Thus, the defect is produced as a result of rounded corners, rather than square corners, being etched in forming the intersection of the pair of intersecting perpendicular lines 22, 24 of the photoresist 16.

Figure 2E:
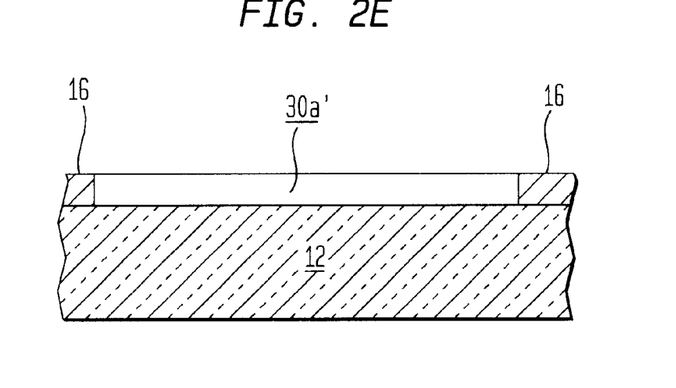
FIG. 2E is a cross section of the mask structure of FIG. 1 having the test pattern etched into a photoresist of the mask structure shown in FIG. 2D, transferred and etched into underlying exposed portions of an opaque layer with the photoresist removed.
Figure 2F:
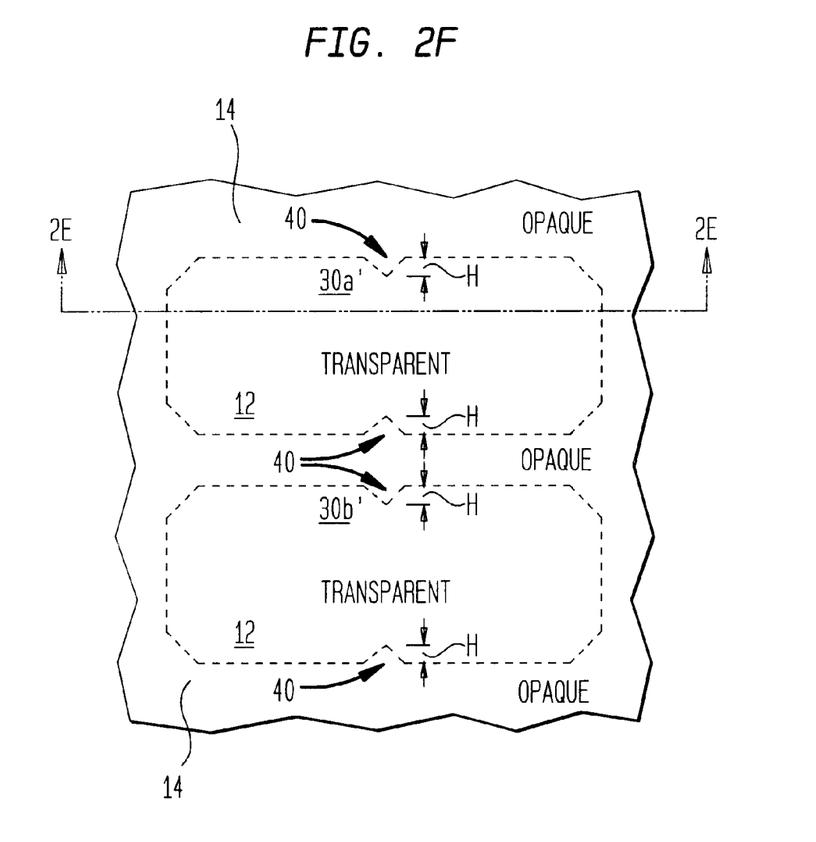
FIG. 2F is a plan view of the mask structure of FIG. 2E having the test pattern etched into a photoresist of the mask structure shown in FIG. 2D, transferred and etched into underlying exposed portions of an opaque layer with the photoresist removed, the cross section of FIG. 2F being taken along line 2E—2E in FIG. 2F.
Figure 2G:
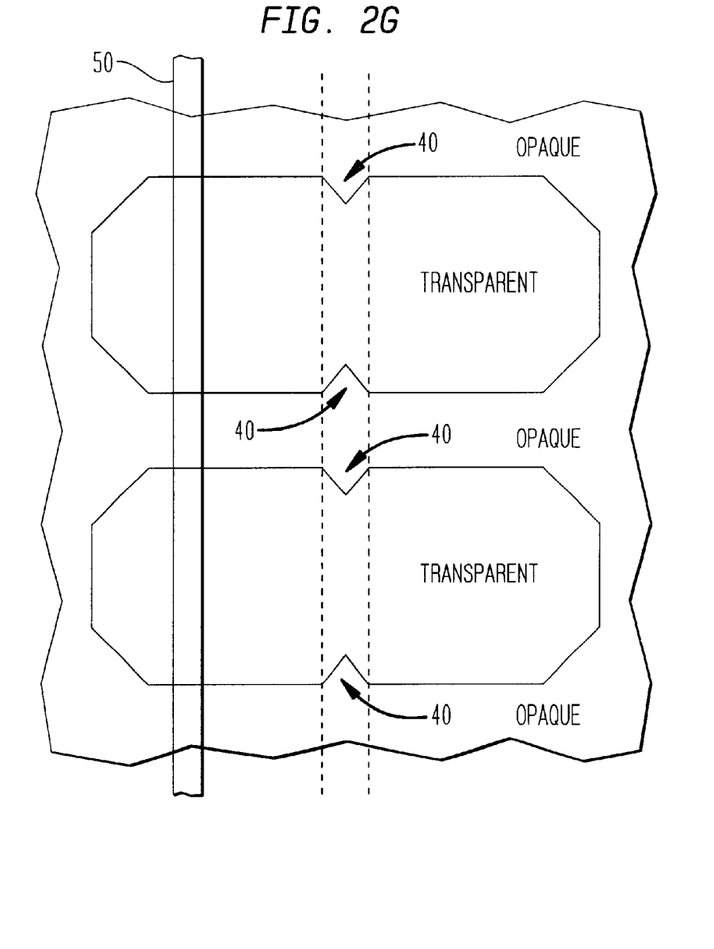
FIG. 2G is a sketch showing a slit used in line width measurement equipment used to determine the degree of corner rounding, such slit shown disposed over a portion of the mask shown of FIG. 2F and adapted to be scanned in a horizontal direction of the mask.
Figure 2H:
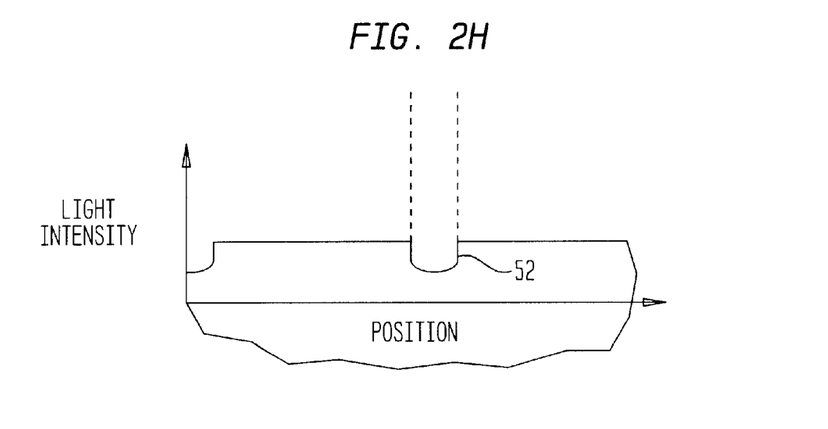
FIG. 2H is a plot of the amount of light passing through the slit of FIG. 2G then through the mask shown in FIG. 2G as a function of the position of the slit over such mask.

Referring now to FIGS. 2E and 2F, the photoresist 16 is removed. It is noted that here the effect of the corner rounding is to leave un-etched triangular-shaped regions 40 (i.e., a corner rounding effect produced defect) in the opaque layer 14. The defect resulting in the mask structure from the corner rounding effect is measured to provide an indication of the degree of such corner rounding. More particularly, measurements are made of the variation in the width of the line of opaque layer using conventional line width measuring instruments. For example, if light is passed through a slit 50 shown in FIG. 2G, and the slit 50 were moved laterally (i.e., here horizontally) along the line, the amount of light (i.e, light intensity) passing through the slit 50 would be some statistical average value when passing over regions of the line not having the triangular-shaped opaque regions 40, and such amount of light would decrease when the slit 50 passed over the triangular-shaped regions 40. For example, referring also to FIG. 2H, the amount of light passing through the slit 50, and then through the transparent portions of the mask as a function of the position of the slit 50 is shown. It is noted that when the slit passes over the relatively straight sides of the rectangular-shaped openings 30'a, 30'b in the opaque layer 14, the light intensity is relatively constant, and an average level can be statistically determined. However, when the slit 50 is over a defect, i.e., here the triangular-shaped regions 40 formed in the opaque layer 14 from corner rounding, a pulse 52 is produced. Thus, non-uniformities in the amount of light as such slit 50 as a function of the position of the slit 50 as the slit 50 is scanned along the mask provides a measure of the size of the triangular-shaped regions 40 and thus a measure of the decree of corner rounding. A quantitative measure of the corner rounding can be obtained by using a calibration procedure which generates a database of amount of light change as a function of the degree of corner rounding (e.g., the radius of the rounded corner).

Figure 3A:
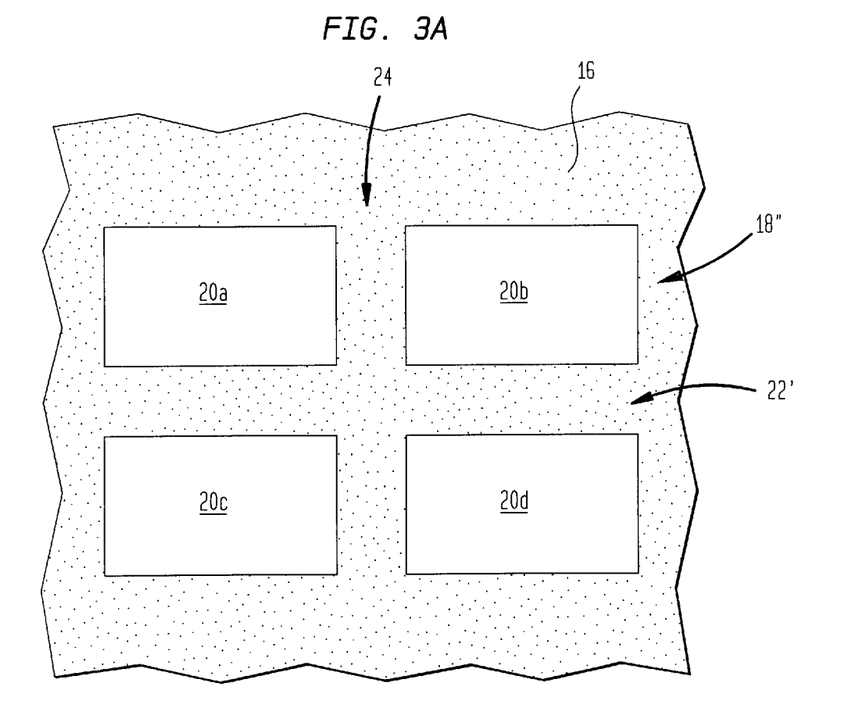
FIG. 3A is a plan view of the mask structure of FIG. 1 having an alternative corner rounding effect test pattern etched into a photoresist of the mask structure under ideal, non-corner rounding conditions.

Referring now to FIG. 3A, an alternative test pattern 18" is etched into the un-patterned mask 10 of FIG. 1. Here, the pattern 18" is similar to the pattern 18 shown in FIG. 1D exempt here the width of both the horizontal line 22' is the same as the width of the vertical line 24 of the photoresist 16. More particularly, both lines 22' and 24 have a width less than, or in the order of, the expected undercutting, D, of the photoresist by the isotropic etch. More particularly, the pattern etched into the photoresist is a four quadrant array of rectangles 20a, 20b, 20c, and 20d. The rectangles 20a, 20b, 20c, and 20d are spaced apart from each other in both the horizontal and vertical directions a distance in the range of the etch undercutting (i.e., edge process bias, D). For example, a typical amount of this undercutting is 100 nm per edge. Thus, the rectangles 20a, 20b, 20c, and 20d are here placed 50 nm apart from each other.

Figure 3B:
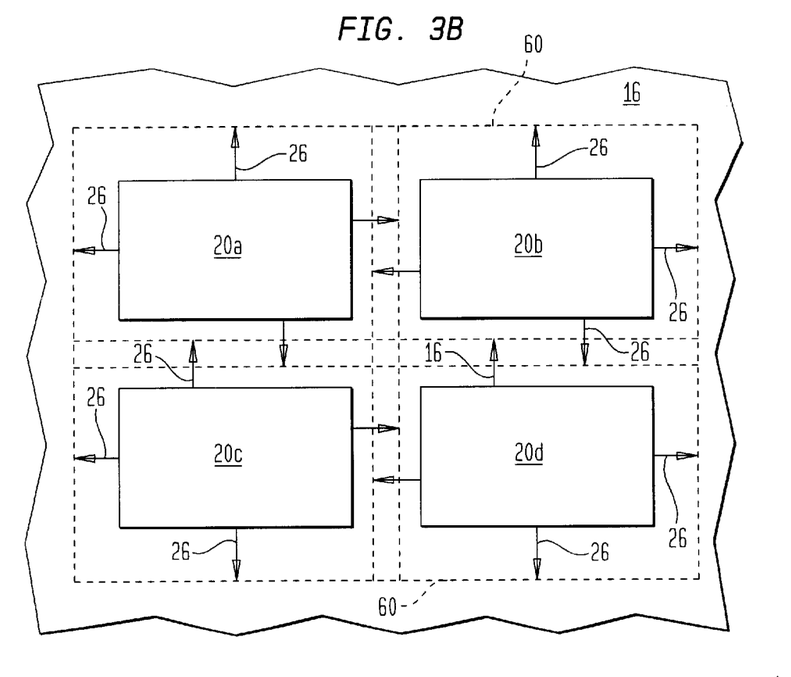
FIG. 3B is a plan view of the mask structure of FIG. 3A having the test pattern etched into a photoresist of the mask structure under the ideal, non-corner rounding conditions, transferred and etched into underlying exposed portions of an opaque layer.
Figure 3C:
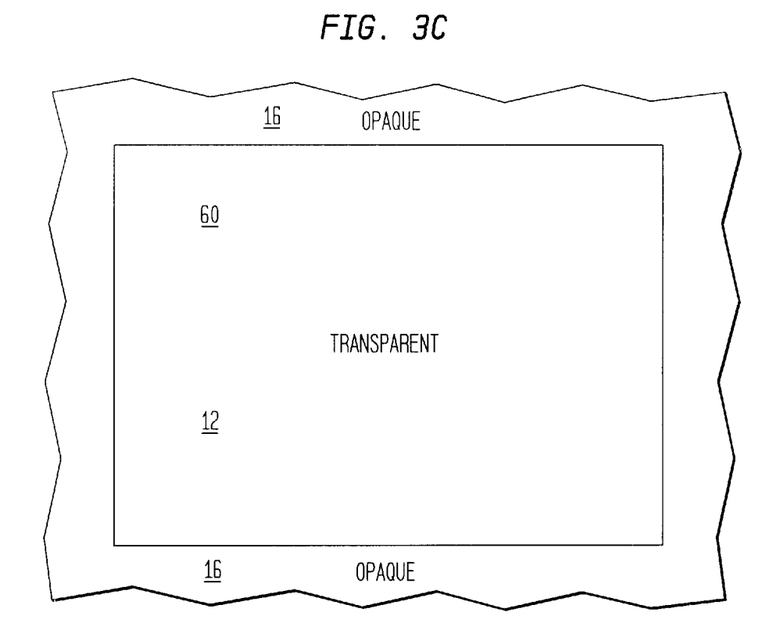
FIG. 3C is a plan view of the mask structure of FIG. 3B having the test pattern etched into a photoresist of the mask structure shown in FIG. 3B under the ideal, non-corner rounding conditions, transferred and etched into underlying exposed portions of an opaque layer with the photoresist removed.
Figure 4A:
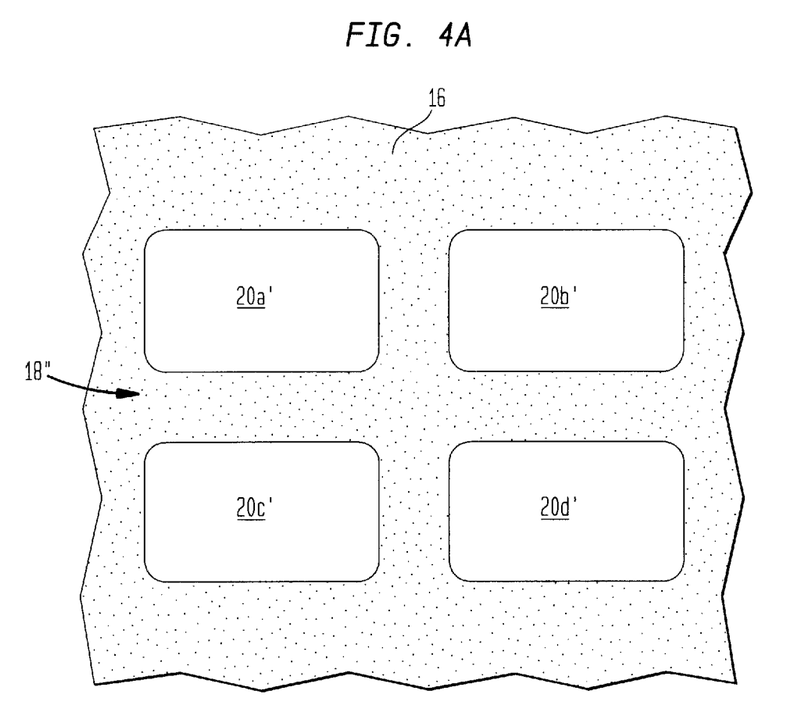
FIG. 4A is a plan view of the mask structure of FIG. 1 having an alternative corner rounding effect test pattern etched into a photoresist of the mask structure under ideal, non-corner rounding conditions.

In the ideal case, shown in FIG. 3B, where there is no corner rounding, the exposure-etching processes would close the gaps between the four rectangles in both the horizontal and vertical directions, as shown by the arrows 16 in FIG. 3B, thereby producing, as shown in FIG. 3C, a single, relatively large rectangular opening 60 in the opaque layer 16 to thereby expose a single relatively large rectangular-shaped region of the surface of the transparent substrate 12. In reality, however, as each of the four smaller rectangles 20a, 20b, 20c and 20d of pattern 18" gets patterned into the photoresist 16, the corners undergo a certain amount corner rounding, as indicated in FIG. 4A. Therefore, after being exposed to the wet isotropic etch, the opaque layer 14 becomes etched under the photoresist 16 as indicated by the dotted lines 62 in FIG. 4B. Thus, the rectangular-shaped openings in the opaque layer 14 abut with a diamond-shaped region 63 of the opaque layer (i.e., a corner rounding effect produced defect) remaining at the region of intersection of the vertical and horizontal lines 22, 24', respectively, of the photoresist 16 separating the four rectangles 20a, 20b, 20c, 20d, shown in FIG. 4B.

Figure 4B:
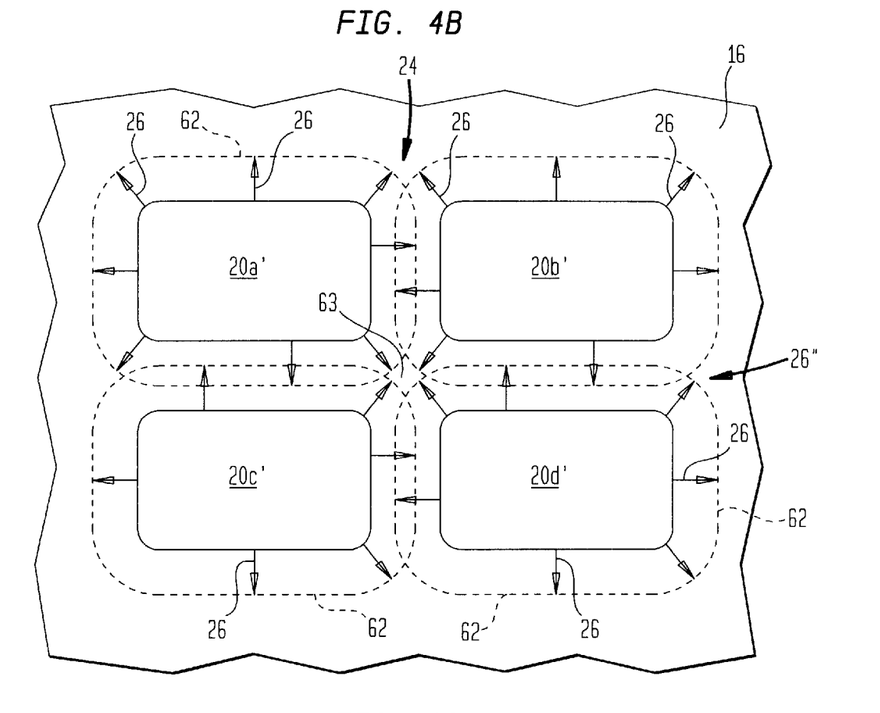
FIG. 4B is a plan view of the mask structure of FIG. 4A having the test pattern etched into a photoresist of the mask structure under the real, corner rounding conditions, transferred and etched into underlying exposed portions of an opaque layer.

Assuming that the process induced edge effect, i.e., undercutting, just closes the gap between the sides of the rectangles, the diagonal of the diamond-shaped region 63 of the opaque layer 16 will equal two times the radius of each of the corners of the rectangles in the opaque layer 14. Thus, a somewhat diamond-like region 63 of etched opaque layer 14 (i.e., a corner rounding effect produced defect) is formed in region where the horizontal and vertical lines 22. 24', respectively, of the photoresist 16 intersected. Here, again, the size of the diamond-shaped region 63 is related to the degree of corner rounding. Still further, the diamond-shaped opaque region 63 can be detected as an apparent defect by standard defect control equipment. Another technique used may include setting a defect detection limit in the defect control tool such that the apparent corner radius can be defined within the limits of setting tool sensitivity.

Figure 4C:
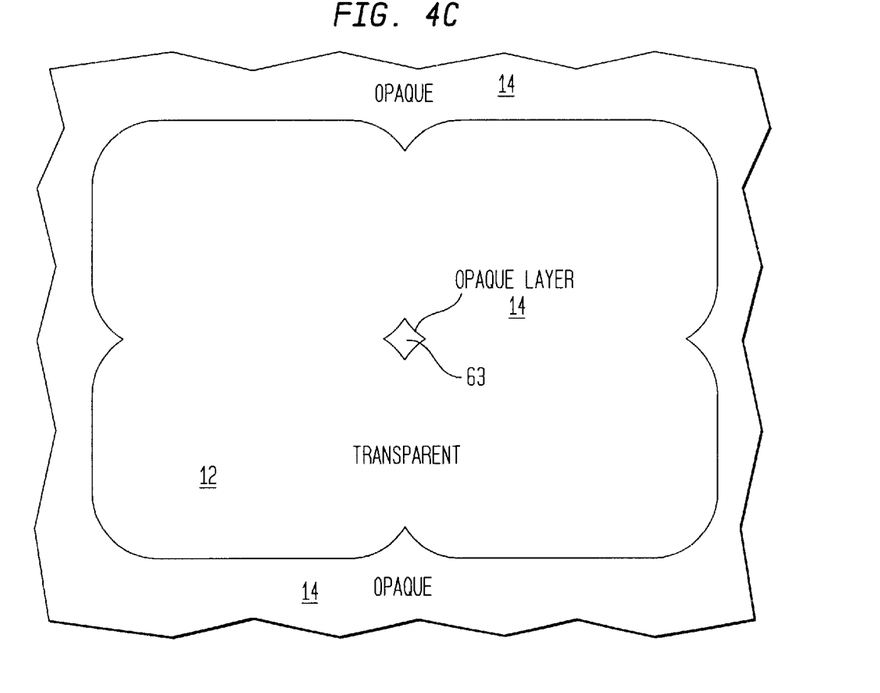
FIG. 4C is a plan view of the mask structure of FIG. 4B having the test pattern etched into a photoresist of the mask structure shown in FIG. 4B, transferred and etched into underlying exposed portions of an opaque layer with the photoresist removed.

Here again, a method is provided for determining a measure of corner rounding produced in a mask structure. The method includes providing an un-patterned mask structure having a transparent substrate, an opaque layer on the substrate and a photoresist on the opaque layer. A corner rounding test pattern is etched into the photoresist. The pattern exposes underlying portions of the opaque layer. The pattern is in the shape of a pair of intersecting perpendicular lines of the photoresist. The exposed portions of the opaque layer are brought into contact with a wet etch to remove the exposed portions of the opaque layer and to thereby expose underlying portions of the substrate. The etch undercuts the photoresist to remove unexposed portions of the opaque layer disposed adjacent to the exposed portions of the opaque layer. The photoresist is removed to produce mask structure. A corner rounding effect produced defect (i.e., the triangle-shaped regions 40 (FIG. 2F) or the diamond-shaped region 63 (FIG. 4C) is produced in the opaque layer 14 of the mask structure, such defect being produced as a result of rounded corners, rather than square corners, being etched in forming the intersection of the pair of intersecting perpendicular lines 22, 24 (FIG. 1A) or 22, 24' (FIG. 4B) of the photoresist 16. The corner rounding effect produced defect 40, 63 is measured to provide an indication of the degree of corner rounding.

A test pattern, not shown, made up of an array of the four quadrant test pattern may be used to form an array of defects to give an average, or statistical, result of corner rounding over a larger surface region of the substrate.

Other embodiments are within the spirit and scope of the amended claims. Further, it should be understood that the term rectangle or rectangular-shaped region or opening includes square or square-shaped regions or openings. Still further, while a wet, isotropic etch has been used to undercut the photoresist, if the rectangular shaped openings are placed very close together, i.e., in a substantially contiguous relationship, a anisotropic, e.g. reactive ion etch can be used instead of the wet etch.

What is claimed is:

1. A method for determining a measure of corner rounding produced in a mask structure, comprising:

provicing an un-patterned mask structure having a transparent substrate, an opaque layer on the substrate and a photoresist on the opaque layer;

etching a corner rounding test pattern into the photoresist, such pattern exposing underlying portions of the opaque layer, such pattern being in the shape of a pair of intersecting perpendicular lines of the photoresist;

bringing the exposed portions of the opaque layer into contact with an etch to remove the exposed portions of the opaque layer to thereby expose underlying portions of the substrate;

removing the photoresist to produce mask structure;

measuring a defect produced in the opaque layer of the mask structure, such defect being produced as a result of rounded corners, rather than square corners, such defect being formed in the opaque layer at a region of the intersection of the pair of intersecting perpendicular lines of the photoresist.

2. The method recited in claim 1 wherein the intersecting lines of the photoresist have widths selected to produce a defect having a size related to the degree of the produced corner rounding.

3. The method recited in claim 2 wherein the measurement includes measuring the size of the produced defect.

4. The method recited in claim 1 wherein the width of one of the intersecting lines of the photoresist is greater than the width of the other one of the intersecting lines.

5. A method for determining a measure of corner rounding produced in a mask structure, comprising:

providing an un-patterned mask structure having a transparent substrate, an opaque layer on the substrate and a photoresist on the opaque layer;

etching a corner rounding test pattern into the photoresist, such pattern exposing underlying portions of the opaque layer, such pattern being formed in a shape comprising:
a first line; and
an array of laterally spaced parallel lines, such parallel lines being perpendicular to, and intersecting, the first line at laterally spaced intersection regions along the first line;

bringing the exposed portions of the opaque layer into contact with an etch to remove the exposed portions of the opaque layer to thereby expose underlying portions of the substrate;

removing the photoresist to produce the mask structure;

measuring a defect produced in the opaque layer of the mask structure along the first line, such defect being produced as a result of rounded corners, rather than square corners, being etched in forming the intersections along the first line by the array of parallel lines.

6. A method for determining a measure of corner rounding produced in a mask structure, comprising:

providing an un-patterned mask structure having a transparent substrate, an opaque layer on the substrate and a photoresist on the opaque layer;

etching a corner rounding test pattern into the photoresist, such pattern exposing underlying portions of the opaque layer, such pattern comprising an array rectangular-shaped openings in the photoresist to expose underlying portions of the opaque layer, such rectangular-shaped openings being separated by a pair of intersecting lines of the photoresist;

bringing the exposed portions of the opaque layer into contact with an etch to remove the exposed portions of the opaque layer to thereby expose underlying portions of the substrates;

wherein a first one of the lines of the photoresist separating the rectangular-shaped openings is in the order of the predetermined undercutting depth;

wherein the etching of the opaque layer forms a triangular-shaped region in the opaque layer as a result of corner rounding effects in forming the array of rectangular-shaped openings in the photoresist, such triangular-shaped region having an altitude along the first one of the lines of the photoresist and a base along a second one of the lines of the photoresist, such altitude being related to the amount of such corner rounding, thereby forming a line of opaque layer having at the region of intersection between the first and second lines greater than the width of in other portions of the such line of opaque layer;

removing the photoresist to produce the mask structure;

measuring variations in the width of the line of opaque layer, such width variations being produced as a result of the altitude of the triangular-shaped region resulting from the rectangular-shaped opening in the photoresist being formed with rounded corners, rather than square corners.

7. A method for determining a measure of corner rounding produced in a mask structure, comprising:

providing an un-patterned mask structure having a transparent substrate, an opaque layer on the substrate and a photoresist on the opaque layer;

etching a corner rounding test pattern into the photoresist, such pattern exposing underlying portions of the opaque layer, such pattern being in the shape of a pair of intersecting perpendicular lines of the photoresist;

bringing the exposed portions of the opaque layer into contact with a wet etch to remove the exposed portions of the opaque layer to thereby expose underlying portions of the substrate, such etch undercutting the photoresist to remove unexposed portions of the opaque layer disposed adjacent to the exposed portions of the opaque layer;

removing the photoresist to produce mask structure;

measuring a defect produced in the opaque layer of the mask structure, such defect being produced as a result of rounded corners, rather than square corners, such defect being formed in the opaque layer at a region of the intersection of the pair of intersecting perpendicular lines of the photoresist.

8. The method recited in claim 7 wherein the intersecting lines of the photoresist have widths selected to produce a defect having a size related to the degree of the produced corner rounding.

9. The method recited in claim 8 wherein the measurement includes measuring the size of the produced defect.

10. The method recited in claim 7 wherein the width of one of the intersecting lines of the photoresist is greater than the width of the other one of the intersecting lines.

11. A method for determining a measure of corner rounding produced in a mask structure, comprising:

providing an un-patterned mask structure having a transparent substrate, an opaque layer on the substrate and a photoresist on the opaque layer;

etching a corner rounding test pattern into the photoresist, such pattern exposing underlying portions of the opaque layer, such pattern being formed in a shape comprising:
a first line; and
an array of laterally spaced parallel lines, such parallel lines being perpendicular to, and intersecting, the first line at laterally spaced intersection regions along the first line;

bringing the exposed portions of the opaque layer into contact with a wet etch to remove the exposed portions of the opaque layer to thereby expose underlying portions of the substrate, such etch undercutting the photoresist to remove unexposed portions of the opaque layer disposed adjacent to the exposed portions of the opaque layer;

removing the photoresist to produce the mask structure;

measuring a defect produced in the opaque layer of the mask structure along the first line, such defect being produced as a result of rounded corners, rather than square corners, being etched in forming the intersections along the first line by the array of parallel lines.

12. A method for determining a measure of corner rounding produced in a mask structure, comprising:

providing an un-patterned mask structure having a transparent substrate, an opaque layer on the substrate and a photoresist on the opaque layer;

etching a corner rounding test pattern into the photoresist, such pattern exposing underlying portions of the opaque layer, such pattern comprising an array rectangular-shaped openings in the photoresist to expose underlying portions of the opaque layer, such rectangular-shaped openings being separated by a pair of intersecting lines of the photoresist;

bringing the exposed portions of the opaque layer into contact with a wet etch to remove the exposed portions of the opaque layer to thereby expose underlying portions of the substrate, such etch undercutting the photoresist a predetermined depth to remove unexposed portions of the opaque layer disposed adjacent to the exposed portions of the opaque layer;

wherein a first one of the lines of the photoresist separating the rectangular-shaped openings is in the order of the predetermined undercutting depth;

wherein the etching of the opaque layer forms a triangular-shaped region in the opaque layer as a result of corner rounding effects in forming the array of rectangular-shaped openings in the photoresist, such triangular-shaped region having an altitude along the first one of the lines of the photoresist and a base along a second one of the lines of the photoresist, such altitude being related to the amount of such corner rounding, thereby forming a line of opaque layer having a at the region of intersection between the first and second lines greater than the width of in other portions of the such line of opaque layer;

removing the photoresist to produce the mask structure;

measuring variations in the width of the line of opaque layer, such width variations being produced as a result of the altitude of the triangular-shaped region resulting from the rectangular-shaped opening in the photoresist being formed with rounded corners, rather than square corners.

* * * * *